(12) United States Patent
Sun

(10) Patent No.: US 8,222,152 B2
(45) Date of Patent: Jul. 17, 2012

(54) METHOD FOR FABRICATING HOLE PATTERN

(75) Inventor: Jun-Hyeub Sun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 254 days.

(21) Appl. No.: 12/774,644

(22) Filed: May 5, 2010

(65) Prior Publication Data

US 2011/0159693 A1    Jun. 30, 2011

(30) Foreign Application Priority Data

Dec. 29, 2009    (KR) .................. 10-2009-0133388

(51) Int. Cl.
*H01L 21/467*    (2006.01)
(52) U.S. Cl. ........ 438/703; 438/700; 438/717; 430/311; 430/314; 257/E21.486
(58) Field of Classification Search .................. 438/700, 438/703, 717; 430/311, 314
See application file for complete search history.

(56) References Cited

U.S. PATENT DOCUMENTS

| | | | |
|---|---|---|---|
| 7,727,899 B2* | 6/2010 | Hayashi | 438/736 |
| 2006/0231900 A1* | 10/2006 | Lee et al. | 257/368 |
| 2008/0124931 A1* | 5/2008 | Lee et al. | 438/692 |
| 2008/0253160 A1* | 10/2008 | Popp et al. | 365/72 |
| 2009/0169832 A1* | 7/2009 | Aton | 428/195.1 |
| 2010/0048024 A1* | 2/2010 | Sugimura | 438/702 |
| 2010/0130011 A1* | 5/2010 | Endoh et al. | 438/689 |

* cited by examiner

*Primary Examiner* — Alexander Ghyka

(74) *Attorney, Agent, or Firm* — IP & T Group LLP

(57) ABSTRACT

A method for fabricating a hole pattern includes forming a first hard mask layer over an etch target layer, forming a second hard mask pattern over the first hard mask layer, which are patterned to be a line type in a first direction and have a selective etch ratio to the first hard mask layer, forming a third hard mask layer over the first hard mask layer to bury a space between adjacent ones of the second hard mask pattern, forming a photoresist pattern over the third hard mask layer, which is patterned to be a line type in a second direction; etching the third hard mask layer using the photoresist pattern to form a third hard mask pattern, removing the photoresist pattern, and etching the first hard mask layer using the second and third hard mask patterns.

17 Claims, 9 Drawing Sheets

(PROIR ART)

(PROIR ART)

(PROIR ART)

(PROIR ART)

METHOD FOR FABRICATING HOLE PATTERN

CROSS-REFERENCE TO RELATED APPLICATIONS

The present invention claims priority of Korean patent application number 10-2009-0133388, filed on Dec. 29, 2009, the disclosure of which is incorporated by reference herein in its entirety.

BACKGROUND OF THE INVENTION

The present invention relates to a method for fabricating a semiconductor device, and more particularly, to a method for fabricating a hole pattern using a double patterning process.

In a fabricating process for a DRAM smaller than a 50 nm process DRAM, it is difficult to fabricate a hole pattern due to limitations on a resolution of a photolithography apparatus. In such a fabrication of a hole pattern, a double patterning technology is used to form a hole. The double patterning technology forms a hole by forming a line in a crossing direction, where such technology is adapted for patterning rather than creating holes.

Recently, in a case where a low-temperature carbon is used as a hard mask, a dual hard mask of a Plasma Enhanced Tetra Ethyl Ortho Silicate (PETEOS) oxide layer and a silicon oxide nitride layer is used for patterning. At this time, the silicon oxide nitride layer, which is an upper layer of the dual hard mask, is etched first, and the PETEOS oxide layer, which is a lower layer of the dual hard mask, is etched using the etched silicon oxide nitride layer and a photoresist pattern as an etch barrier.

FIGS. 1A to 1D are perspective views illustrating a conventional method for forming a hole pattern.

Referring to FIG. 1A, an amorphous carbon layer 12, a PETEOS oxide layer 13, a silicon oxide nitride layer 14, and an anti-reflective coating (ARC) layer 15 are sequentially formed over an etch-target layer 11. The amorphous carbon layer 12 is used as a hard mask to etch the etch-target layer 11, the PETEOS oxide layer 13 is used as a basic hard mask during a double patterning process, and the silicon oxide nitride layer 14 is used as a hard mask to etch the PETEOS oxide layer 13.

A first photoresist pattern 16 is formed over the ARC layer 15. The first photoresist pattern 16 is formed as a line type in a first direction.

Subsequently, the ARC layer 15 and the silicon oxide nitride layer 14 are etched using the first photoresist pattern 16 as an etch barrier. Since the first photoresist pattern 16 is the line type, the ARC layer 15 and the silicon oxide nitride layer 14 are also formed as a line type in the first direction.

Referring to FIG. 1B, a silicon oxide nitride pattern 14A is formed by removing the first photoresist pattern 16 and the ARC layer 15 (shown in FIG. 1A).

Referring to FIG. 1C, a second photoresist pattern 17 is formed over a resultant structure including the silicon oxide nitride pattern 14A. The second photoresist pattern 17 may be formed as a line type in a second direction which is perpendicular to the first direction. Accordingly, a hole pattern is defined by the second photoresist pattern 17 and the silicon oxide nitride pattern 14A.

Referring to FIG. 1D, the PETEOS oxide layer 13 is etched using the second photoresist pattern 17 and the silicon oxide nitride pattern 14A as an etch barrier (shown in FIG. 1C), thereby forming a PETEOS oxide pattern 13A. The PETEOS oxide pattern 13A defines the hole pattern.

As described above, in the conventional method for forming the double hole pattern, the hole pattern is defined by the second photoresist pattern 17 and the silicon oxide nitride pattern 14A. However, since the conventional method uses different masks subject to the same etch conditions, etch characteristics may differ between the different masks, e.g., a Critical Dimension (CD) bias. Furthermore, when the PETEOS oxide layer is etched using the second photoresist pattern, a wiggling can occur due to characteristics of an etch process for an oxide layer, which has a high ion energy.

FIG. 2 is a picture showing a wiggling of the conventional method for forming the hole pattern.

Referring to FIG. 2, the wiggling 100 occurs in the second photoresist pattern used as an etch barrier during etching the PETEOS oxide layer.

SUMMARY OF THE INVENTION

Embodiments of the present invention are directed to providing a method for fabricating a hole pattern, which can prevent a wiggling due to etch barriers having etch characteristics different from each other during a double patterning process.

In accordance with an aspect of the present invention, there is provided a method for fabricating a hole pattern, including: forming a first hard mask layer over an etch target layer; forming a second hard mask pattern over the first hard mask layer, the second hard mask pattern being patterned to be a line type in a first direction and having a selective etch ratio to the first hard mask layer; forming a third hard mask layer over the first hard mask layer including the second hard mask pattern to bury a space between adjacent ones of the second hard mask pattern; forming a photoresist pattern over the third hard mask layer, the photoresist pattern being patterned to be a line type in a second direction; etching the third hard mask layer using the photoresist pattern to form a third hard mask pattern; removing the photoresist pattern; and etching the first hard mask layer using the second and third hard mask patterns.

The first hard mask layer may comprise a poly silicon layer, the second hard mask pattern may comprise a nitride layer or a silicon nitride oxide layer, and the third hard mask layer may comprise an oxide layer.

The third hard mask layer may comprise a step coverage to bury the space between the adjacent ones of the second hard mask pattern, thereby having a minimum thickness to bury all the space between the adjacent ones of the second hard mask pattern and to not protrude greatly over the second hard mask pattern in height.

The third hard mask layer may be formed by Atomic Layer Deposition (ALD) or a Chemical Mechanical Deposition (CMD) using a furnace.

The first direction may be symmetrical to the second direction. The first direction may have a tilt angle of approximately 45 degree while the second direction may have a tilt angle of approximately −45 degree. The first direction may have a tilt angle of approximately 45 degree to approximately 60 degree.

The etching of the third hard mask layer may be performed by a self-aligned contact (SAC) etch process by using a selective etch ratio of a nitride layer and an oxide layer, and may use a CxFy-based gas, where x and y are positive integers and y divided by x is smaller than or equal to three. The CxFy-based gas may comprise $C_4F_6$ or $C_4F_8$ gas. The etching of the third hard mask may be performed by using an oxygen ($O_2$) gas in addition to the CxFy-based gas.

The method may further comprise forming a stacked layer of a multi-function hard mask (MFHM) layer and one of an amorphous carbon layer and a Spin-on Coating (SoC) layer over the third hard mask layer. The removing of the photoresist pattern may be performed by a dry strip process using oxygen ($O_2$) plasma. The stacked layer may be removed by using oxygen ($O_2$) plasma during removing the photoresist pattern.

DESCRIPTION OF SPECIFIC EMBODIMENTS

Other objects and advantages of the present invention can be understood by the following description, and become apparent with reference to the embodiments of the present invention.

FIGS. 3A to 8B are cross-sectional views and plane views illustrating a method for fabricating a hole pattern in accordance with an embodiment of the present invention. Each of FIGS. 3A, 4A, 5A, 6A, 7A and 8A is a cross-sectional view illustrating the method for fabricating the hole pattern while each of FIGS. 3B, 4B, 5B, 6B, 7B and 8B is a plane view illustrating the method for fabricating the hole pattern. For conciseness, each cross-sectional view and plane view of FIGS. 3A to 8B are explained in pairs.

Figure 1A:
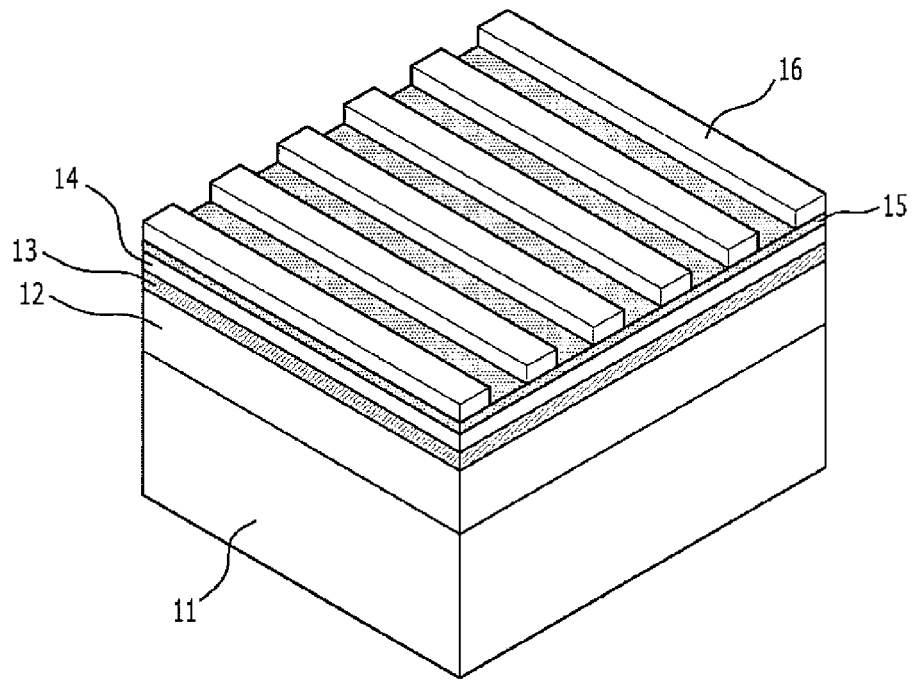
FIGS. 1A to 1D are perspective views illustrating a conventional method for forming a hole pattern.
Figure 1B:
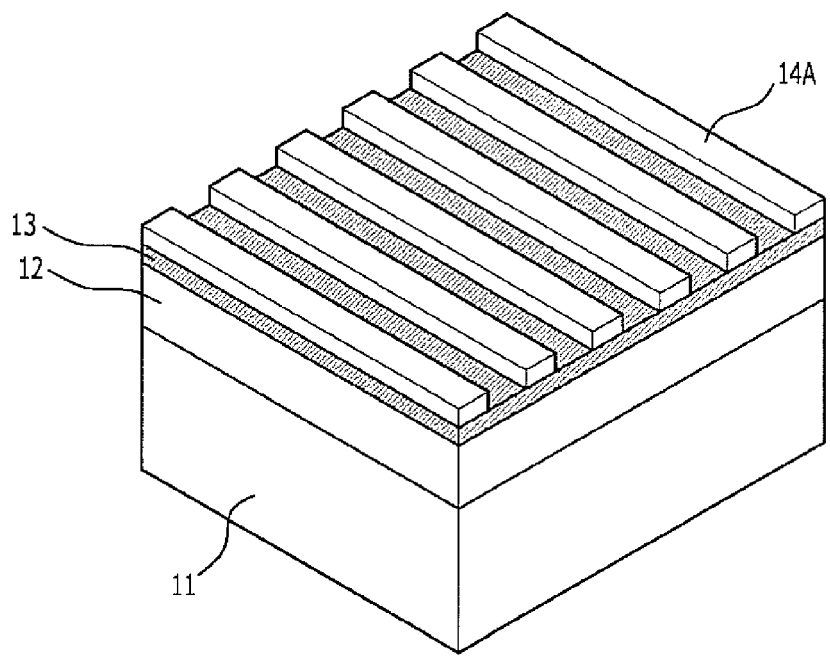
Figure 1C:
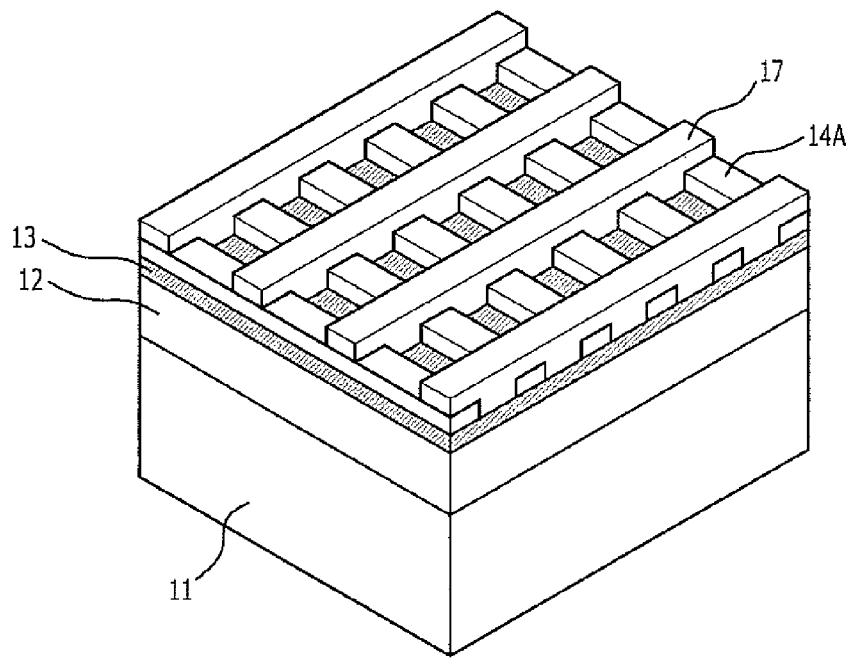
Figure 1D:
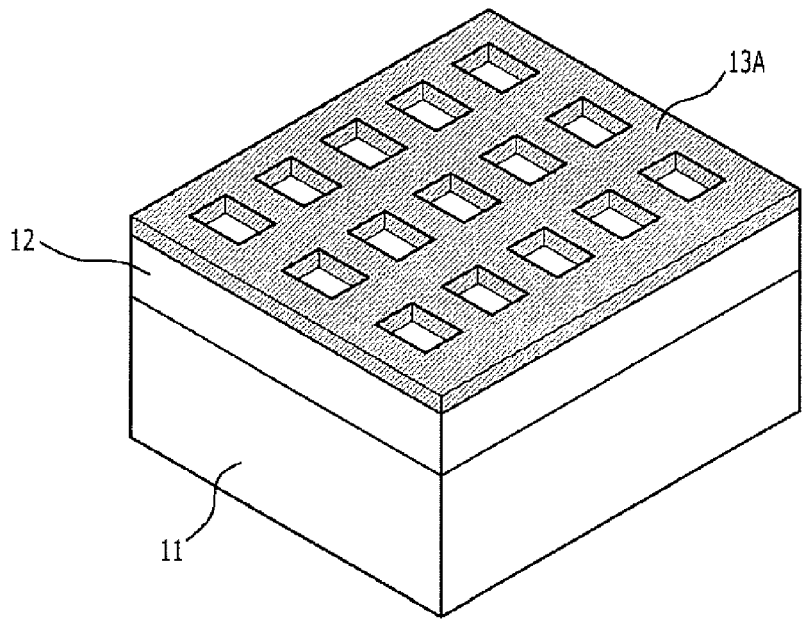
Figure 2:
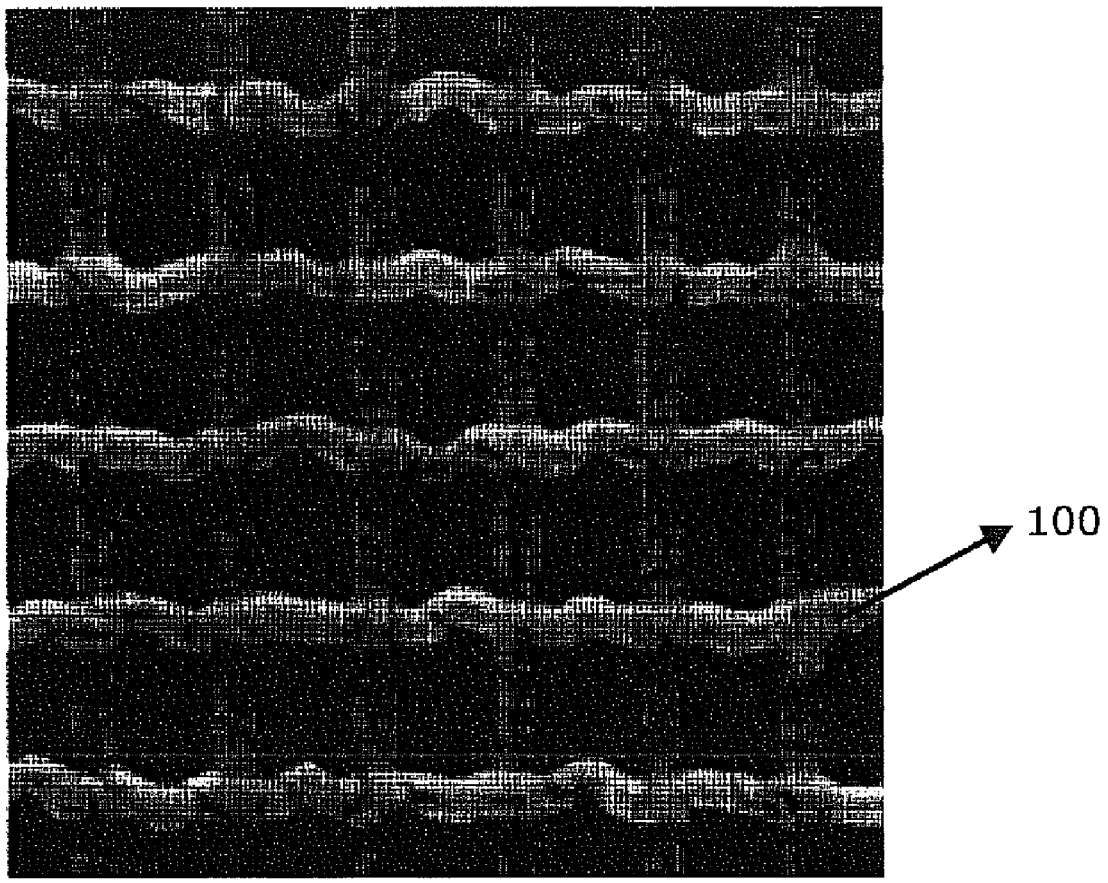
FIG. 2 is a picture showing a wiggling of the conventional method for forming the hole pattern.
Figure 3A:
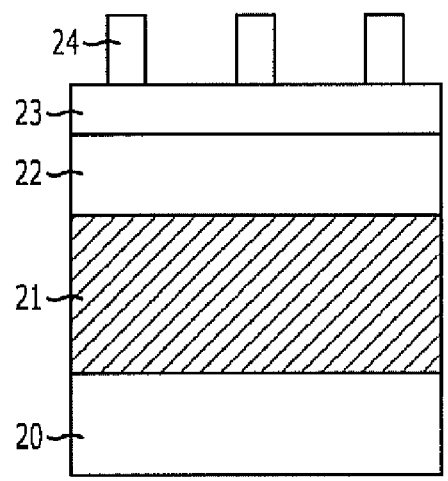
FIGS. 3A to 8B are cross-sectional views and plane views illustrating a method for fabricating a hole pattern in accordance with an embodiment of the present invention.
Figure 3B:
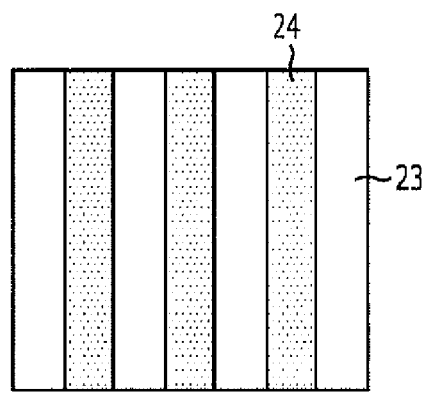

Referring to FIGS. 3A and 3B, a first hard mask layer 20 is formed over an etch target layer (not shown). The first hard mask layer 20 may be formed of a poly silicon to etch the etch target layer.

Subsequently, a second hard mask layer 21, a first mask layer 22, and a second mask layer 23 are sequentially formed over the first hard mask layer 20. The second hard mask layer 21 may be used to etch the first hard mask layer 20 and have a selective etch ratio to the first hard mask layer 20 (for example, a ratio of etch rates). When the first hard mask layer 20 is formed of a poly silicon, the second hard mask layer 21 may be formed of a nitride layer or a silicon nitride oxide layer. According to an embodiment, the nitride layer includes a silicon nitride.

The first mask layer 22 may be used to etch the second hard mask layer 21 and have a selective ratio to the first hard mask layer 20 as well as the second hard mask layer 21. When the first hard mask layer 20 is formed of a poly silicon and the second hard mask layer 21 is formed of a nitride layer, the first mask layer 22 may be formed of an amorphous carbon. The second mask layer 23 is used to etch the first mask layer 22. The second mask layer 23 may be formed of a silicon oxide nitride (SiON) layer.

Subsequently, a first photoresist pattern 24 is formed over the second mask layer 23. The first photoresist pattern 24 is patterned to have a line type in a first direction. Before forming the first photoresist pattern 24, an anti-reflective coating (ARC) layer (not shown) may be formed over the second mask layer 23.

The first photoresist pattern 24 has a tilt angle which is determined based on a target shape of the hole pattern. Preferably, in a case where the target shape of the hole pattern is a circle shape, the first photoresist pattern 24 may be formed to have a tilt angle of approximately 45 degree. In case where the target shape of the hole pattern is an oval shape, the first photoresist pattern 24 may be formed to have a tilt angle ranging from approximately 45 degree to approximately 60 degree.

Subsequently, the second mask layer 23 and the first mask layer 22 are etched using the first photoresist pattern 24 as an etch barrier. At this time, when the second mask layer 23 is formed of a silicon oxide nitride (SiON) layer, the etch process is performed using Tetrafluoromethane ($CF_4$) gas, or a mixed gas of $CF_4$ gas and Fluoroform ($CHF_3$) gas.

Figure 4A:
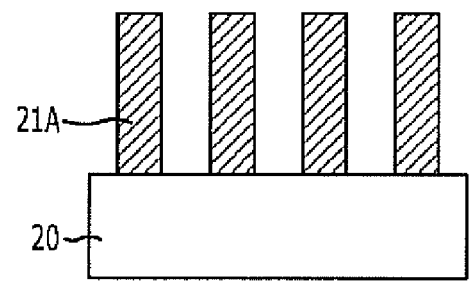
Figure 4B:
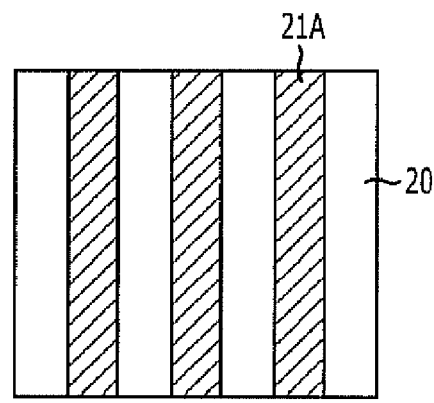

Referring to FIGS. 4A and 4B, the second hard mask layer 21 (shown in FIGS. 3A and 3B) is etched by using the first mask layer 22 (shown in FIGS. 3A and 3B) as an etch barrier, thereby forming a second hard mask pattern 21A. The second hard mask pattern 21A is patterned to be a line type in the same direction as the first photoresist pattern 24, i.e., in the first direction.

When the second hard mask pattern 21A is formed, it is preferable to remove the first photoresist pattern 24, the second mask layer 23 and the first mask layer 22 (shown in FIGS. 3A and 3B). For this, a dry strip process may be performed to remove the remaining photoresist pattern and hard mask layer after forming the second hard mask pattern 21A. The dry strip process may be performed using oxygen plasma.

Figure 5A:
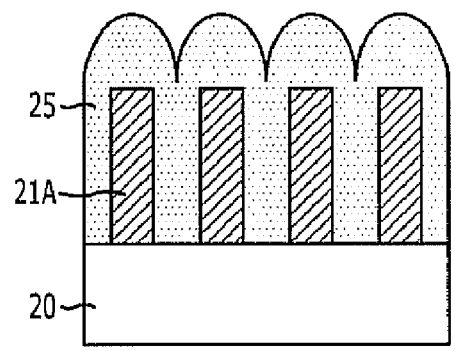
Figure 5B:
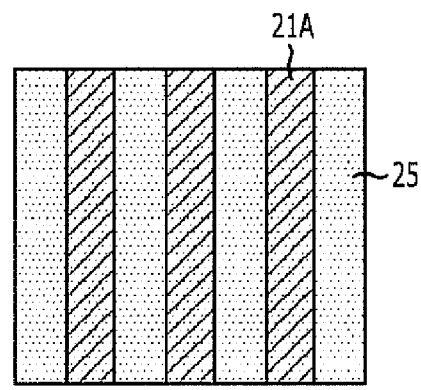

Referring to FIGS. 5A and 5B, a third hard mask layer 25 is formed over the first hard mask layer 20 including the second hard mask pattern 21A. The third hard mask layer 25 may have a selective etch ratio to the second hard mask pattern 21A and the first hard mask layer 20. When the first hard mask layer 20 is formed of a poly silicon layer and the second hard mask pattern 21A is formed of a nitride layer, the third hard mask layer 25 may be formed of an oxide layer.

In particular, the third hard mask layer 25 has a step coverage to bury a space between adjacent ones of the second hard mask pattern 21A. The third hard mask layer 25 may be formed by Atomic Layer Deposition (ALD) or a Chemical Mechanical Deposition (CMD) using a furnace. The third hard mask layer 25 has a minimum thickness to bury all the spaces between the adjacent ones of the second hard mask pattern 21A to not protrude greatly over the second hard mask pattern 21A in height.

Figure 6A:
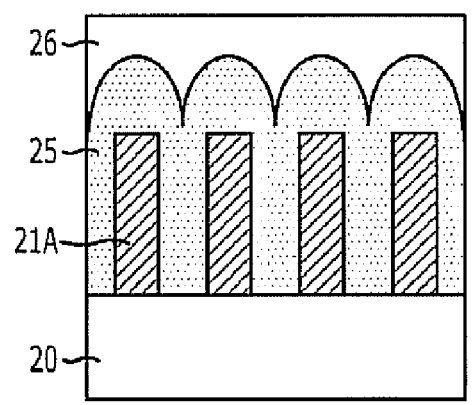
Figure 6B:
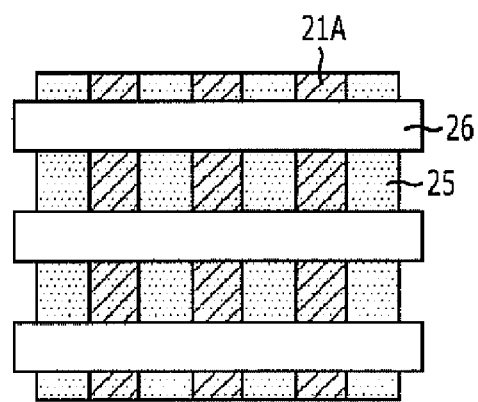

Referring to FIGS. 6A and 6B, a second photoresist pattern 26 is formed over the third hard mask layer 25. At this time, a tilting photolithography is performed to make the second photoresist pattern 26 to have a tilt angle symmetrical to that of the second hard mask pattern 21A based on a target shape of the hole pattern. Preferably, in a case where the target shape of the hole pattern is a circle shape, the second photoresist pattern 26 may be formed to have a tilt angle of approximately −45 degree while the second hard mask pattern 21A has a tilt angle of approximately 45 degree.

Accordingly, the second photoresist pattern 26 is patterned to have a line type in a second direction crossing the first direction of the second hard mask pattern 21A. According to an exemplary embodiment of the present invention, since the third hard mask layer 25 is formed to bury the space between the adjacent ones of the second hard mask pattern 21A, a height difference is alleviated during forming the second photoresist pattern 26.

Before forming the second photoresist pattern 26, a stacked layer of a multi-function hard mask (MFHM) layer and one of an amorphous carbon layer and a Spin-on Coating (SoC) layer may be formed over the third hard mask layer 25 to secure an etch margin.

Figure 7A:
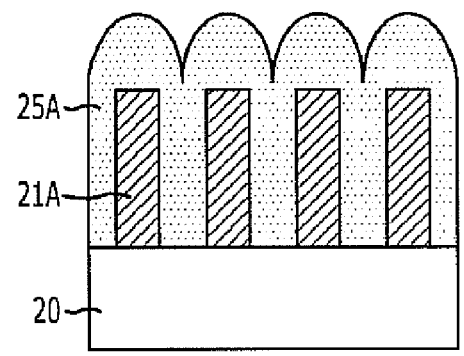
Figure 7B:
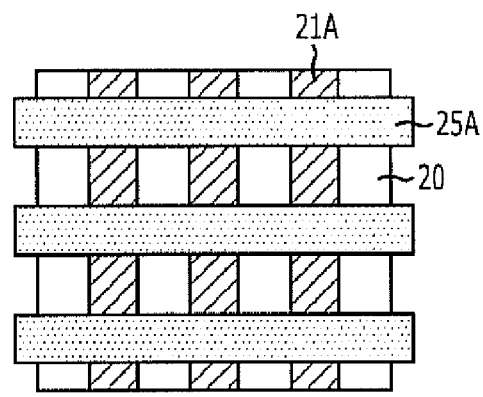

Referring to FIGS. 7A and 7B, the third hard mask layer 25 is etched by using the second photoresist pattern 26 as an etch barrier (shown in FIGS. 6A and 6B), thereby forming a third hard mask pattern 25A. The etch process is performed by a self-aligned contact (SAC) etch process in order to minimize loss of the second hard mask pattern 21A.

At this time, by using a selective etch ratio of a nitride layer and an oxide layer, only the oxide layer is selectively etched. For this, CxFy-based gas is used to etch the oxide layer, where x and y are positive integers and y divided by x is smaller than or equal to three. The CxFy-based gas may include $C_4F_6$ or $C_4F_8$ gas, and a mixed gas including an oxygen ($O_2$) gas in addition to the CxFy-based gas may be used to etch the oxide layer.

Subsequently, the second photoresist pattern 26 (shown in FIGS. 6A and 6B) is removed. A dry strip process may be performed to remove the second photoresist pattern 26, and the dry strip process may be performed using oxygen ($O_2$) plasma. In a case where the stacked layer of the MFHM layer and one of the amorphous carbon layer and the SoC layer is formed before forming the second photoresist pattern 26, all the stacked layer may be removed by using oxygen ($O_2$) plasma.

Accordingly, the hole pattern is defined by the second hard mask pattern 21A formed to be a line type in the first direction and the third hard mask pattern 25A formed to be a line type in the second direction.

Figure 8A:
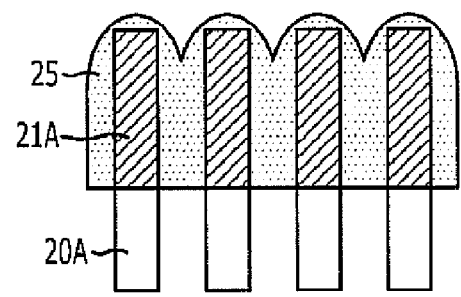
Figure 8B:
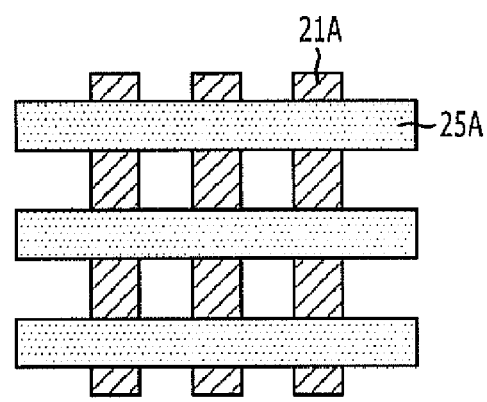

Referring to FIGS. 8A and 8B, the first hard mask layer 20 is etched using the second hard mask pattern 21A and the third hard mask pattern 25A as etch barriers (shown in FIGS. 7A and 7B), thereby forming a first hard mask pattern 20A. When the first hard mask layer 20 is formed of a poly silicon, the etch process may be performed using a mixed gas of hydrogen bromide (HBr) and chlorine ($Cl_2$) in addition to a mixed gas of a nitrogen ($N_2$) gas and an oxygen ($O_2$) gas.

According to an exemplary embodiment of the present invention, since the etch process to form the first hard mask pattern 20A uses the second hard mask pattern 21A of a nitride layer and the third hard mask pattern 25A of an oxide layer as the etch barriers, a wiggling occurring during an etch process using a photoresist pattern may be prevented/reduced. Furthermore, since etch characteristics of the nitride layer and the oxide layer during the etch process of the first hard mask layer 20 of a poly silicon are similar, an asymmetry to the first hard mask pattern 20A may be minimized.

While, in the exemplary embodiment of the present invention, the first hard mask layer is formed of the poly silicon, the second hard mask layer is formed of the nitride layer, and the third hard mask layer is formed of the oxide layer, materials having a selective etch ratio can be selectively used for the first to third hard mask layers without limitations on materials of the first to third hard mask layers.

In another embodiment, when an amorphous carbon is used as the first hard mask layer, the second hard mask layer may be selected from a group consisting of a nitride layer, a poly silicon layer and an oxide layer. At this time, when one of the nitride layer and the oxide layer is used as the second hard mask layer, the third hard mask layer may be formed of a poly silicon layer. On the contrary, when a poly silicon layer is used as the second hard mask layer, the third hard mask layer is formed of one of the nitride layer and the oxide layer.

As described above, a method for fabricating a hole pattern of the present invention can prevent/reduce a wiggling since a photoresist layer is not used as a hard mask layer for forming the hole pattern. Furthermore, it is possible to finely fabricate a hole pattern using a double patterning process.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a hole pattern, comprising:
    forming a first hard mask layer over an etch target layer;
    forming a second hard mask pattern over the first hard mask layer, the second hard mask pattern being patterned to be a line type in a first direction and having a selective etch ratio to the first hard mask layer;
    forming a third hard mask layer over a top surface of the first hard mask layer including the second hard mask pattern to bury a space between adjacent ones of the second hard mask pattern;
    forming a photoresist pattern over the third hard mask layer, the photoresist pattern being patterned to be a line type in a second direction;
    etching the third hard mask layer using the photoresist pattern to form a third hard mask pattern;
    removing the photoresist pattern; and
    etching the first hard mask layer using the second and third hard mask patterns.

2. The method of claim 1, wherein the first hard mask layer comprises a poly silicon layer.

3. The method of claim 1, wherein the second hard mask pattern comprises a nitride layer or a silicon nitride oxide layer.

4. The method of claim 1, wherein the third hard mask layer comprises an oxide layer.

5. The method of claim 1, wherein the third hard mask layer comprises a step coverage to bury the space between the adjacent ones of the second hard mask pattern.

6. The method of claim 1, wherein the third hard mask layer has a minimum thickness to bury all the space between the adjacent ones of the second hard mask pattern and to not protrude greatly over the second hard mask pattern in height.

7. The method of claim 1, wherein the third hard mask layer is formed by Atomic Layer Deposition (ALD) or a Chemical Mechanical Deposition (CMD) using a furnace.

8. The method of claim 1, wherein the first direction is symmetrical to the second direction.

9. The method of claim 8, wherein the first direction has a tilt angle of approximately 45 degree while the second direction has a tilt angle of approximately −45 degree.

10. The method of claim 8, wherein the first direction has a tilt angle of approximately 45 degree to approximately 60 degree.

11. The method of claim 1, wherein the etching of the third hard mask layer is performed by a self-aligned contact (SAC) etch process by using a selective etch ratio of a nitride layer and an oxide layer.

12. The method of claim 11, wherein the etching of the third hard mask layer is performed by using a CxFy-based gas, where x and y are positive integers and y divided by x is smaller than or equal to three.

13. The method of claim 12, wherein the CxFy-based gas comprises $C_4F_6$ or $C_4F_8$ gas.

14. The method of claim 12, wherein the etching of the third hard is mask layer is performed by using an oxygen ($O_2$) gas in addition to the CxFy-based gas.

15. The method of claim 1, further comprising:
    forming a stacked layer of a multi-function hard mask (MFHM) layer and one of an amorphous carbon layer and a Spin-on Coating (SoC) layer over the third hard mask layer.

16. The method of claim 15, wherein the removing of the photoresist pattern is performed by a dry strip process using oxygen ($O_2$) plasma.

17. The method of claim 16, wherein the stacked layer is removed by using oxygen ($O_2$) plasma during removing the photoresist pattern.

* * * * *